US006172396B1

(12) United States Patent
Chang

(10) Patent No.: US 6,172,396 B1
(45) Date of Patent: *Jan. 9, 2001

(54) ROM STRUCTURE AND METHOD OF MANUFACTURE

(75) Inventor: Kohsing Chang, Hsinchu (TW)

(73) Assignee: Worldwide Semiconductor Manufacturing Corp., Hsinchu (TW)

( * ) Notice: This patent issued on a continued prosecution application filed under 37 CFR 1.53(d), and is subject to the twenty year patent term provisions of 35 U.S.C. 154(a)(2).

Under 35 U.S.C. 154(b), the term of this patent shall be extended for 0 days.

(21) Appl. No.: 09/065,781

(22) Filed: Apr. 23, 1998

(30) Foreign Application Priority Data

Feb. 3, 1998 (TW) .................................. 87101266

(51) Int. Cl.$^7$ .............................................. H01L 21/8247
(52) U.S. Cl. ............................ 257/316; 438/970; 438/264
(58) Field of Search .................................. 438/257–267, 438/970; 257/315–322

(56) References Cited

U.S. PATENT DOCUMENTS 5,641,696 * 6/1997 Takeuchi ............................... 438/257
5,707,898 * 1/1998 Keller et al. .......................... 438/265
5,970,342 * 10/1999 Wu ......................................... 438/260
6,031,264 * 2/2000 Chien et al. .......................... 257/315

* cited by examiner

Primary Examiner—Richard Booth
(74) Attorney, Agent, or Firm—Thomas, Kayden, Horstemeyer & Risley

(57) ABSTRACT

A read-only memory structure and method of manufacture comprising the steps of sequentially forming a tunneling oxide layer, a first polysilicon layer, a bottom oxide layer and a silicon nitride layer over a semiconductor substrate having field oxide layers already formed thereon. A mask is used to pattern the various layers above the semiconductor substrate forming a floating gate out of the first polysilicon layer. Thereafter, a doped region in formed in the semiconductor substrate, and then a chemical vapor deposition method is used to form a top oxide layer and a second silicon nitride layer over the first silicon nitride layer. Subsequently, the second silicon nitride layer is etched back to form spacers on the sidewalls of the floating gate. Next, thermal oxidation is carried out so that the doped region is oxidized into an etching barrier layer while a silicon oxy-nitride layer is formed over the surface of the spacers. Thereafter, an annealing operation is performed to densify the oxide layer. A second polysilicon layer is then formed over various layers above the substrate, followed by patterning and etching of the second polysilicon layer to form a control gate. Finally, portions of the substrate are doped to form the source/drain region of the memory unit.

7 Claims, 7 Drawing Sheets

ROM STRUCTURE AND METHOD OF MANUFACTURE

CROSS-REFERENCE TO RELATED APPLICATION

This application claims the priority benefit of Taiwan application serial no. 87101266, filed Feb. 3, 1998, the full disclosure of which is incorporated herein by reference.

BACKGROUND OF THE INVENTION

1. Field of Invention

The present invention relates to a method for manufacturing a type of semiconductor device. More particularly, the present invention relates to a method for manufacturing flash memory cells.

2. Description of Related Art

Read-only memory (ROM) is a type of non-volatile memory. Any data programmed into the memory is not be erased when the power source is cut off. Erasable programmable ROM (EPROM) is another type of ROM whose stored data can be erased so that fresh data can be re-programmed in. However, the erasing operation requires ultra-violet light and so packaging cost is high. Moreover, in a data-erasing operation, all the data stored within the memory is wiped out and every bit of data has to be re-entered, which is rather time-consuming. Even only minor alterations to the data inside the EPROM require complete reprogramming.

Another type of ROM that also permits the erase of stored data is the electrically erasable programmable ROM (EEPROM). Instead of totally erasing all the data inside the memory as in an EPROM, data can be erased and re-programmed in a bit-by-bit manner. Furthermore, data can be stored, read out or erased many times in its working life. In recent years, a faster version of EEPROM has developed; its storage/retrieval time is between 70 ns to 80 ns. The U.S. firm Intel coined the name, "flash memory", for this type of memory. Flash memory has a structure similar to an EEPROM. The main difference is in the way memory is erased. The memory inside an EEPROM is erased in a block-by-block manner, and hence the erasing speed can be very fast. Whole chunks of memory can be erased in just one or two seconds, and so much reprogramming time can be saved.

FIG. 1a is a top view showing the transistor memory structure of a conventional flash memory. In FIG. 1a, label S represents the source region of a transistor while label D represents the gate region of the transistor. The cells are arranged in such a way that a group of 16 memory units is joined to the same contact opening. FIG. 1b is a cross-sectional view along line AA' of FIG. 1a showing a memory unit. The memory unit of a flash memory is constructed from a floating transistor having a basic two-layer structure. One of the layers is a floating gate layer 10. The floating gate layer 10 is fabricated from a polysilicon material and is used for charge storage. The other layer is a control gate 12. The control gate 12 is used for controlling data storage and retrieval. Furthermore, the transistor also includes a tunnel oxide layer 14, a drain region 16, a source region 18 and a deeply doped source region 20. The floating gate 10 is located below the control gate 12. In general, the floating gate 10 is unconnected to any other circuits, hence remaining in a floating state, and the control gate 12 is connected to a word line.

The floating transistor utilizes channel hot electrons in the channel to operate. To store a bit of data, a first voltage is applied to the drain region 16 of the semiconductor substrate 22 and a second voltage higher than the first voltage is applied to the control gate 12. Hot electrons then flow out from the source region 18, tunnel through the tunneling oxide layer 14 in the neighborhood of the drain region 16, and finally inject into the floating gate 10. With electrons injected into the floating gate 10, the threshold voltage of this floating transistor is increased and the goal of data storage is achieved. To erase a bit of data, a positive voltage of appropriate magnitude is applied to the source region 18. Electrons trapped within the floating gate 10 are then able to flow out via the tunneling oxide layer 14. In this manner, the memory bit is erased and the floating transistor is returned to its previous state.

FIGS. 2a and 2b are cross-sectional views showing the progression of manufacturing steps in forming a conventional flash memory. First, as shown in FIG. 2a, a semiconductor substrate 100 is provided. Next, a thin tunneling oxide layer 120, preferably having a thickness less than 100 Å, is formed over the semiconductor substrate 100 using, for example, a thermal oxidation method. The tunneling oxide layer 120 generally has a high dielectric constant, a low oxide charge and a high breakdown voltage. Thereafter, a first polysilicon layer 140 is deposited over the tunneling oxide layer 120, and then the polysilicon layer 140 is patterned to form a floating gate. Subsequently, a dielectric layer 160 having, for example, an oxide/nitride/oxide (ONO) multi-layered structure is formed over the first polysilicon layer 140. A second polysilicon layer 180 is deposited over the dielectric layer 160, and then the second polysilicon layer 180 is patterned forming the stacked gate structure 200 of a flash memory.

Next, as shown in FIG. 2b, an ion implantation is carried out implanting N-type ions, such as arsenic (As) ions, into the semiconductor substrate 100. Consequently, a heavily doped region is formed on each side of the stacked gate structure 200. The two heavily doped regions are the respective source/drain regions 220.

In the above conventional method of forming a flash memory, no etching barrier layers are erected prior to either the patterning of the first polysilicon layer to form the floating gate or patterning the second polysilicon layer to form the control gate. Therefore, during the process of removing portions of the first polysilicon layer or the second polysilicon layer, over-etching may occur resulting in the formation of trenches in the source regions, as shown in FIG. 1a 13 area. Conventionally, there are a few technical methods of dealing with the over-etching problem. One method is to rely on the fabrication process itself to control the trench depth. However, this method is rather unreliable because it is very difficult to precisely control the etching depth; it is further limited by junction depth in the source/drain regions. Another method is to pattern with a mask and then perform an arsenic implantation targeting the trench locations so that a sufficiently thick layer of etching barrier layer is produced. However, this method requires additional mask-making operations, thereby complicating the fabrication process. In a third method, the floating gate itself acts as a mask when arsenic implantation is performed so that no additional mask making steps are required. However, in this case, an oxide etching barrier layer will be formed on the sidewall of the floating gate. This thick oxide layer along the sidewalls of the floating gate lowers the coupling rate between the floating gate and the control gate.

In light of the foregoing, there is a need to improve the method of manufacturing flash memory.

SUMMARY OF THE INVENTION

Accordingly, the present invention is to provide a ROM structure having spacers on the sidewalls of the floating gate so that when a subsequent oxidation reaction is carried out to form the etching barrier layer there is no reaction on the floating gate sidewalls. Therefore, an etching barrier layer for preventing the formation of trenches is formed while the coupling rate between the floating gate and the control gate is maintained.

In another aspect, this invention is to provide a ROM manufacturing method that is capable of eliminating buried trenches in the source/drain regions without lowering the coupling rate between the floating gate and the control gate or the data storage capacity, and that furthermore does not increase the number of masks used.

To achieve these and other advantages and in accordance with the purpose of the invention, as embodied and broadly described herein, the invention provides a ROM structure and method of manufacture. The method of forming the ROM structure includes the steps of sequentially forming a tunneling oxide layer, a first polysilicon layer, a bottom oxide layer and a silicon nitride layer over a semiconductor substrate having field oxide layers already formed thereon. Next, a mask is used to pattern the various layers above the semiconductor substrate forming a floating gate out of the first polysilicon layer. Thereafter, an ion implantation is performed, implanting impurities into a portion of the semiconductor substrate. Subsequently, a top oxide layer and a second silicon nitride layer are formed over the various layers above the substrate. Then, the second silicon nitride layer is etched back to form spacers on the sidewalls of the floating gate. A thermal oxidation is carried out so that an oxide layer of sufficient thickness is formed over the doped substrate region; at the same time, a silicon oxy-nitride layer is formed on the surface of the sidewall spacer. The oxide layer acts as an etching barrier layer. Subsequently, an annealing operation is carried out to densify the oxide layer. A second polysilicon layer is then formed over various layers above the substrate, followed by patterning and etching the second polysilicon layer into a control gate. Finally, portions of the substrate are doped to form the source/drain region of the memory unit.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

FIG. 4f is a cross-sectional view along line AA' of FIG. 3;

DESCRIPTION OF THE PREFERRED EMBODIMENTS

Figure 1A:
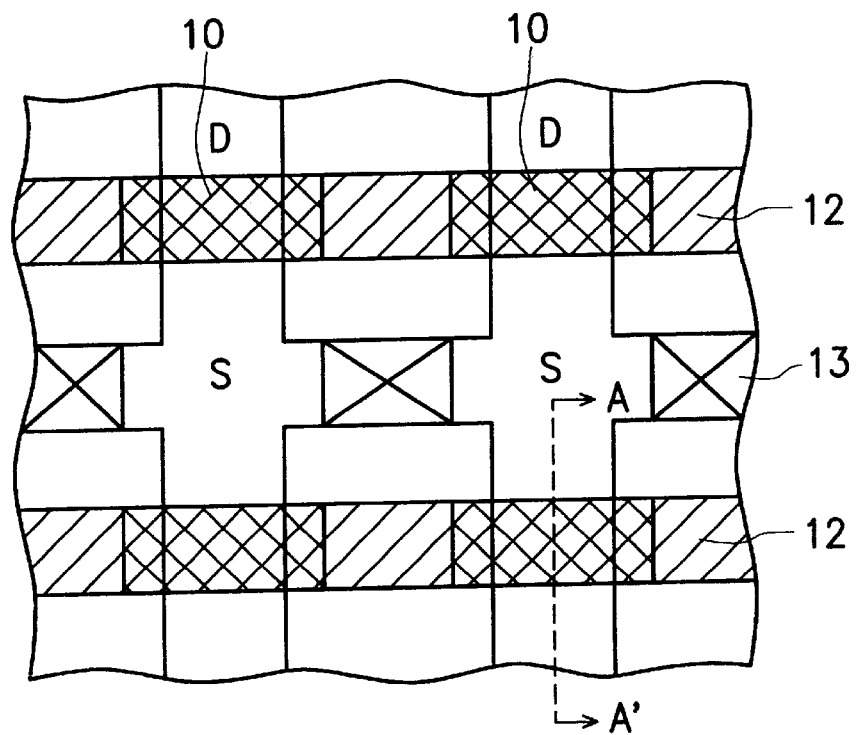
FIG. 1a is a top view showing the transistor memory structure of a conventional flash memory.
Figure 1B:
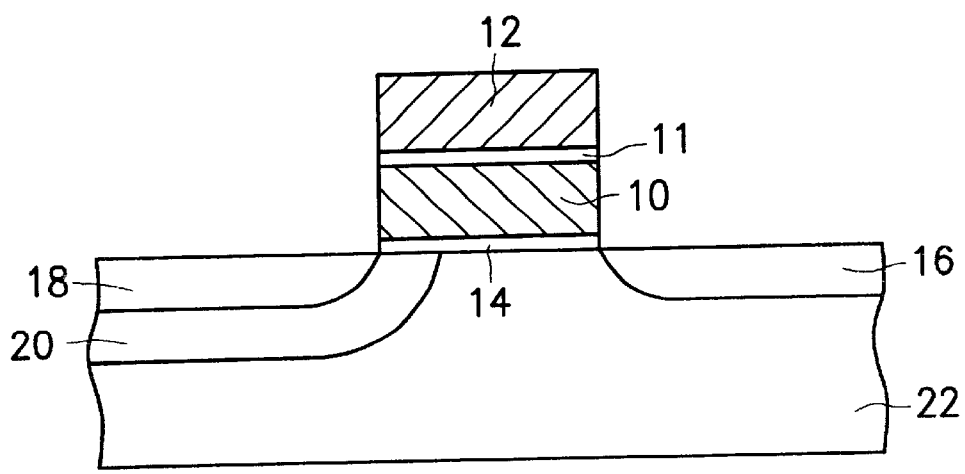
FIG. 1b is a cross-sectional view along line AA' of FIG. 1a showing a memory unit.
Figure 2A:
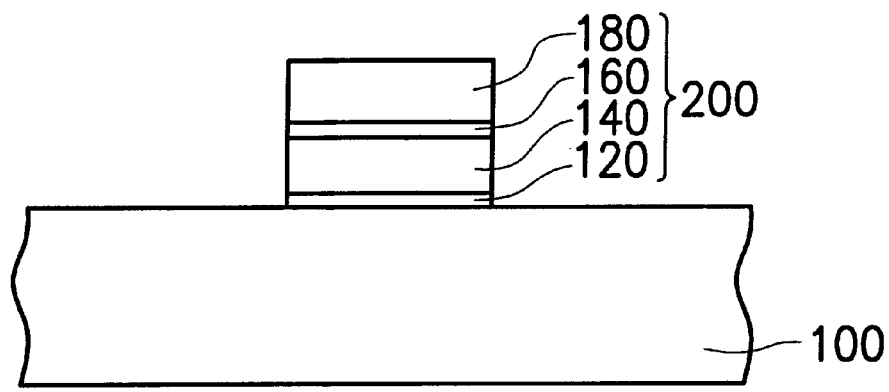
FIGS. 2a and 2b are cross-sectional views showing the progression of manufacturing steps in forming a conventional flash memory.
Figure 2B:
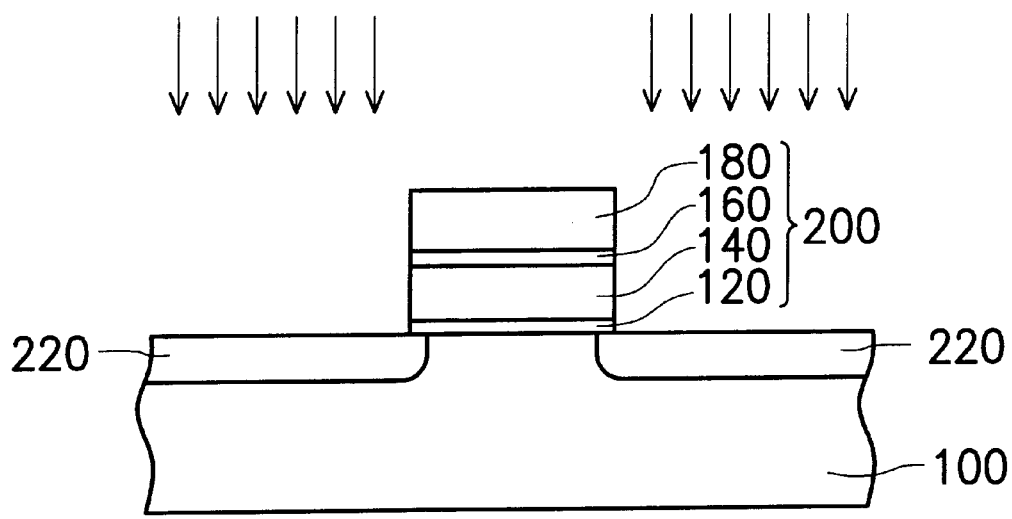

Reference will now be made in detail to the present preferred embodiments of the invention, examples of which are illustrated in the accompanying drawings. Wherever possible, the same reference numbers are used in the drawings and the description to refer to the same or like parts.

Figure 3:
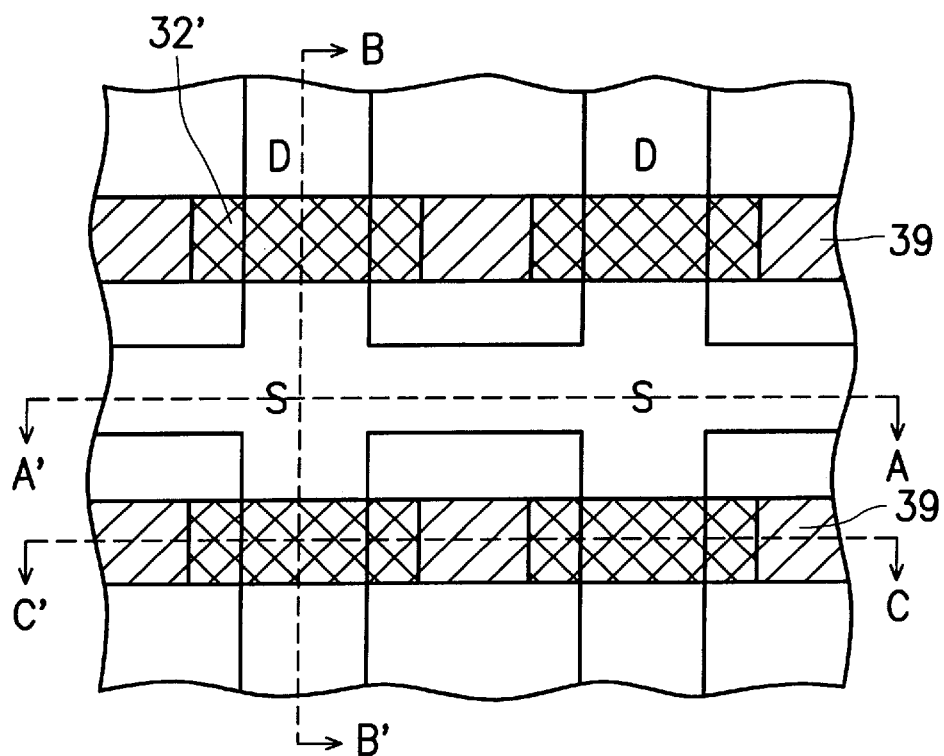
FIG. 3 is a top view showing a flash memory structure according to one preferred embodiment of this invention.

FIG. 3 is a top view showing a flash memory structure according to one preferred embodiment of this invention, wherein the positively slashed area representing the floating gate area and the reverse slashed area representing the control gate area are perpendicular to each other, and the overlapping area (cross-hatched area) represents a memory cell. FIGS. 4a through 4f are cross-sectional views showing the progression of manufacturing steps in forming a flash memory according to one preferred embodiment of this invention, wherein FIG. 4f is a cross-sectional view along line AA' of FIG. 3, FIG. 4g is a cross-sectional view along line BB' of FIG. 3, and FIG. 4h is a cross-sectional view along line CC' of FIG. 3.

Figure 4A:
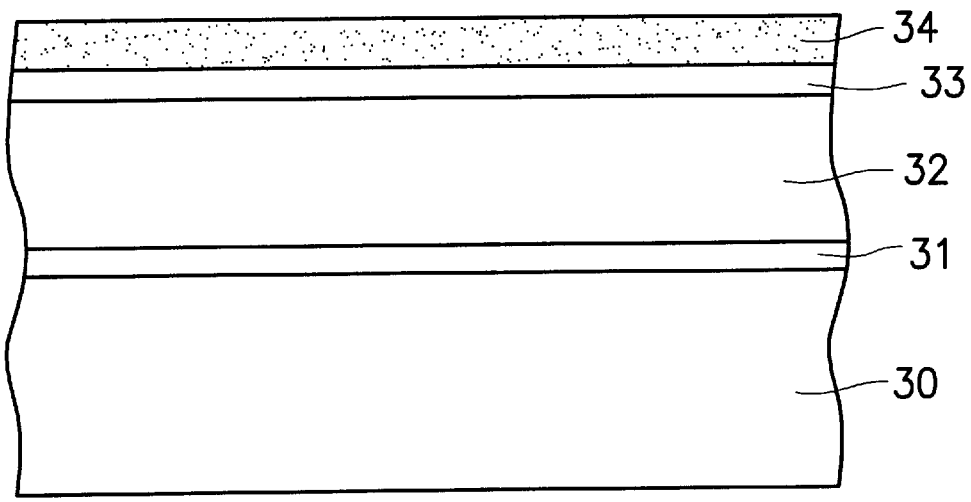
FIGS. 4a through 4f are cross-sectional views showing the progression of manufacturing steps in forming a flash memory according to one preferred embodiment of this invention.

First, as shown in FIGS. 3 and 4a, a semiconductor substrate 30, for example, a silicon substrate, is provided. Device isolation components such as field oxide layers or shallow trench isolations (not shown) are formed in the substrate 30. Next, a tunneling oxide layer 31, a first polysilicon layer 32, a bottom oxide layer 33 and a first silicon nitride layer 34 are sequentially formed over the substrate 30. The tunneling oxide layer 31, having a thickness less than 100 Å by thermal oxidation. The first silicon nitride layer 34 can be formed using, for example, a low-pressure chemical vapor deposition method.

Figure 4B:
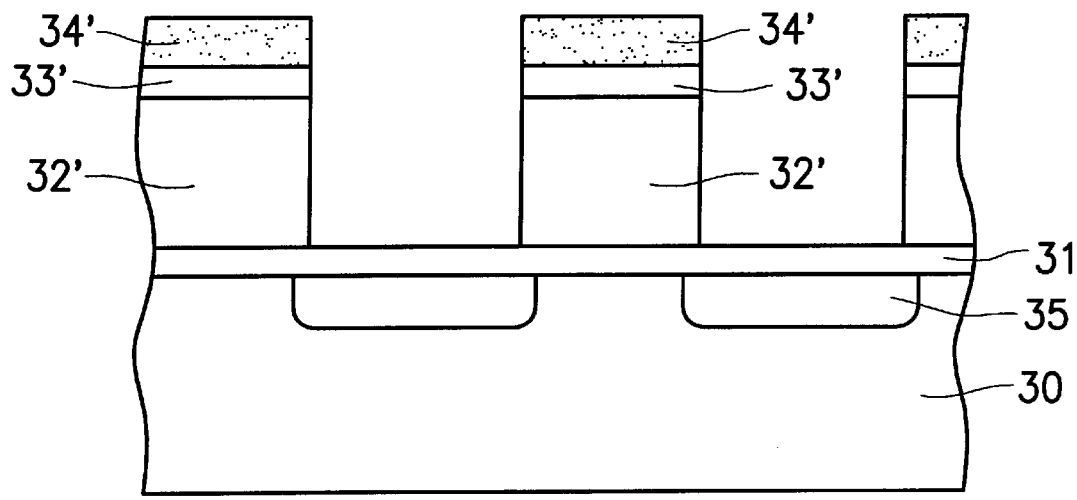

Next, as shown in FIG. 4b, a patterned mask is used to remove a portion of the silicon nitride layer 34, the bottom oxide layer 33 and the first polysilicon layer 32, exposing the tunneling oxide layer 31. Hence, a floating gate 32' constructed from the first polysilicon layer is established. Subsequently, an ion implantation operation is carried out implanting ions, such as arsenic ions, into a portion of the semiconductor substrate. Consequently, a doped region 35 is formed in that portion of the substrate 30 underneath the tunneling oxide layer 31 and between the floating gates 32'.

Figure 4C:
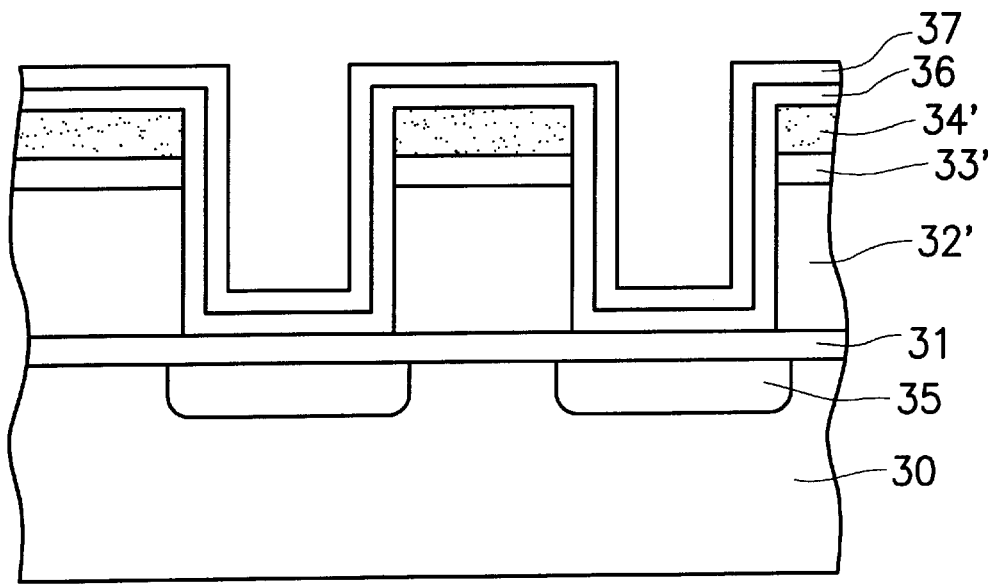

Thereafter, as shown in FIG. 4c, a top oxide layer 36 is formed covering the structure shown in FIG. 4b. The top oxide layer 36 can be formed, for example, by a chemical vapor deposition method. Subsequently, a second silicon nitride layer 37 is formed over the top oxide layer 36. The second silicon nitride layer 37 can be formed using a low-pressure chemical vapor deposition method, for example.

Figure 4D:
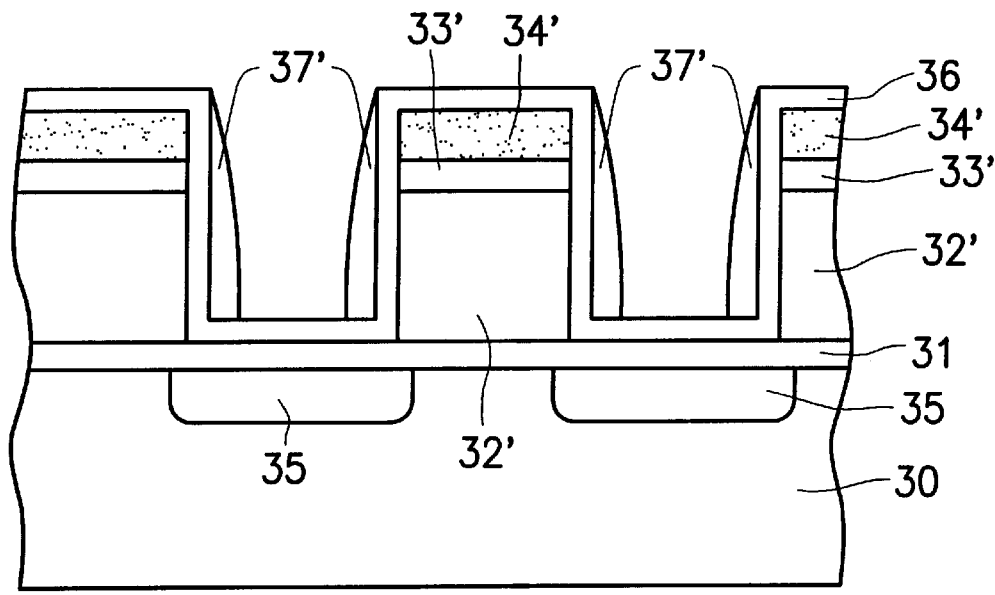

Next, as shown in FIG. 4d, the second silicon nitride layer 37 is etched to form spacers 37' on the sidewalls of the top oxide layer 36, exposing a portion of the upper surface of the top oxide layer 36. The second silicon nitride layer 37 can be etched using an etching back method.

Figure 4E:
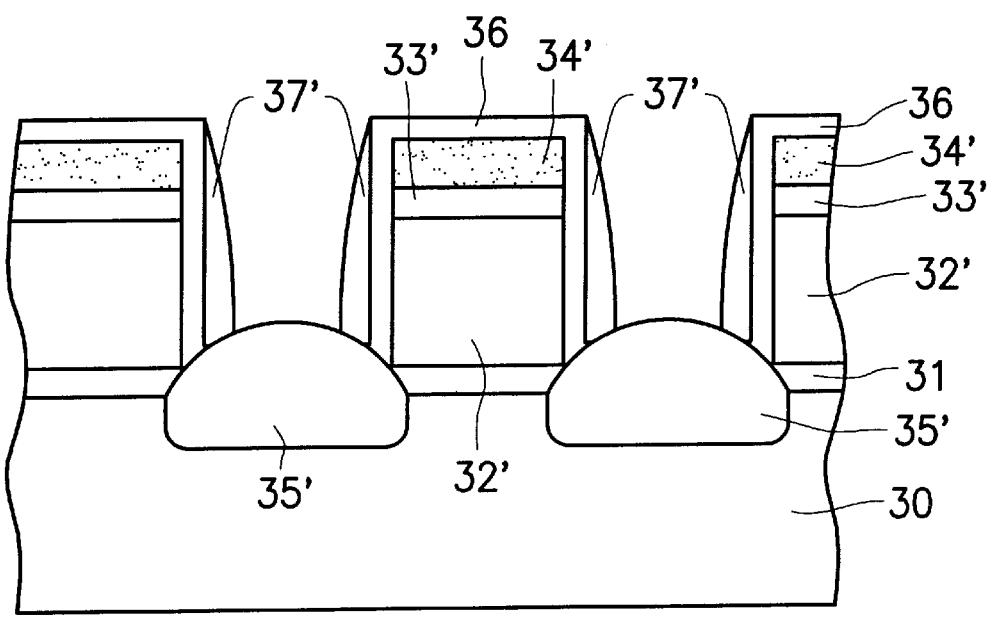
Figure 4F:
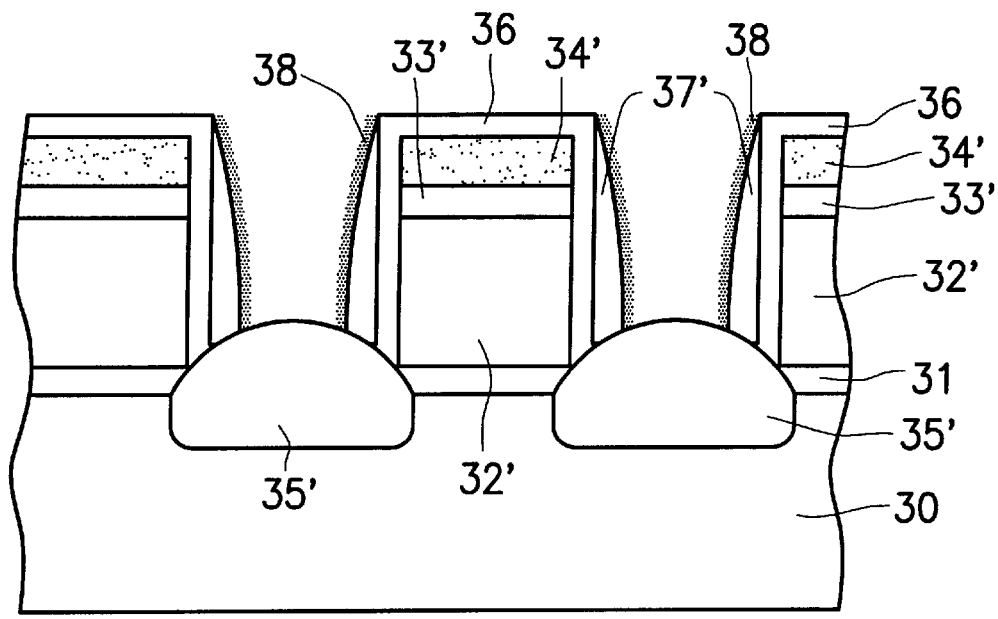
Figure 4G:
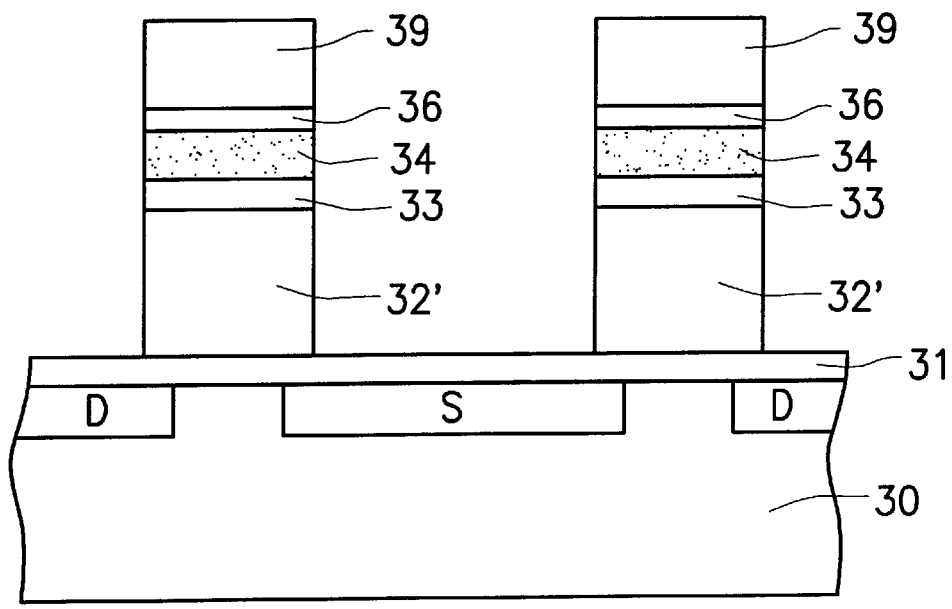
FIG. 4g is a cross-sectional view along line BB' of FIG. 3.
Figure 4H:
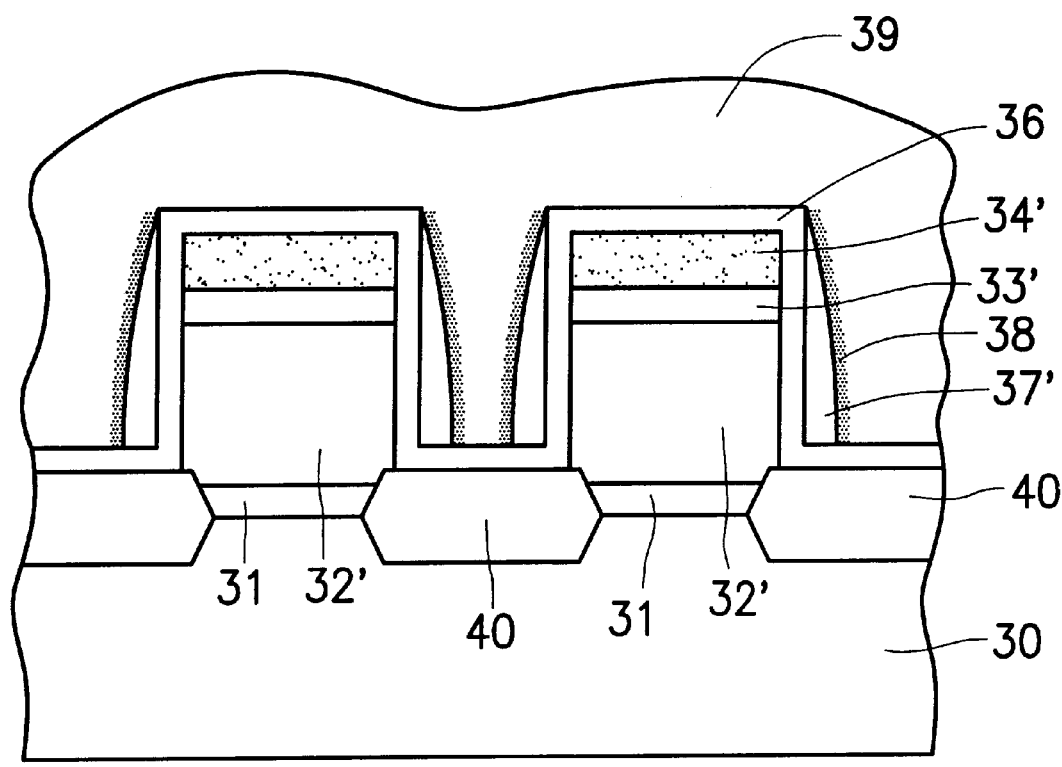
FIG. 4h is a cross-sectional view along line CC' of FIG. 3.

In the subsequent step, as shown in FIG. 4e, thermal oxidation is carried out so that the ion-doped region 35 is oxidized into an ion-doped oxide region 35'. In fact, oxidative reaction starts in two locations, one region being the ion-doped region 35 as described above, the other region being the surface of the silicon nitride spacers 37'. The silicon nitride spacers 37' provide a layer of protection preventing the formation of a thick oxide layer on the sidewalls of the floating gate 32'. Hence, the coupling rate between the floating gate and the control gate can be maintained. A portion of the silicon nitride on the surface of the spacers 37' will react with oxygen to form a thin silicon oxy-nitride layer 38, as shown in FIG. 4f. Thereafter, an annealing operation is performed, densifying the oxide layer into a more compact dielectric layer. The dielectric layer is a multi-layer construct including the bottom oxide layer 33', the first silicon nitride layer 34' and the top oxide layer 36. Next, a second polysilicon layer is formed over the annealed semiconductor substrate (not shown). Then, the second polysilicon layer is patterned and etched to form a control gate 39 as shown in FIG. 4h, where field oxide layers 40 are also seen on the semiconductor substrate 30. Finally, ions are implanted into specified regions of the substrate 30 to form source/drain (S/D) regions.

Next, as shown in FIG. 4f, the second polysilicon layer is removed in a subsequent etching operation. The doped oxide layer 35' is formed because an etching barrier layer is required. The etching barrier layer is used for preventing over-etching of the substrate, which may result in the formation of a trench when the second polysilicon layer is etched. Finally, in FIG. 4g, the doped source/drain (S/D) regions, the floating gate 32', the dielectric layer (including the bottom oxide layer 33, the first silicon nitride layer 34 and the top oxide layer 36) and the control gate 39 can be seen above the semiconductor substrate 30.

One conventional method implants ions into the substrate to form a sufficiently thick etching oxide layer, thereby preventing the formation of buried trench. However, this method requires additional mask-making operations, thereby complicating the fabrication process and increasing production cost. In another conventional method, the floating gate itself acts as a mask when ion implantation is performed, thereby saving mask-making operations. This method, however, cannot prevent the formation of an oxide layer on the sidewall of the floating gate. Consequently, this thick oxide layer along the sidewalls of the floating gate results in a lower coupling rate between the floating gate and the control gate. Hence, conventional methods cannot tackle both problems at once.

In summary, the fabrication method for forming ROM according this invention is characterized by its capacity to prevent the formation of a buried trench in the substrate without lowering the coupling rate between the floating gate and the control gate or the data storage capacity. In addition, this invention will not require an increase in the number of masks used. Secondly, this invention is characterized by ion implantation of the substrate using silicon nitride as sidewall spacers so that a sufficiently thick etching barrier layer can be produced in subsequent thermal oxidation. The thick barrier layer is able to protect the substrate against over-etching reactions that may result in trench formation.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A read-only memory structure formed above a semiconductor substrate having field oxide layer formed thereon, comprising:

a tunneling oxide layer formed over the semiconductor substrate;

a stacked structure formed over the tunneling oxide layer;

a top oxide layer formed over the semiconductor substrate to cover the stacked structure;

spacers formed on the sidewalls of the stacked structure but separated therefrom by the top oxide layer, wherein spacers at least cover the sidewalls of the floating gate;

an etching barrier layer on the semiconductor substrate exposed by the field oxide layer, wherein the etching barrier layer is formed by implanting ions into the substrate followed by oxidation;

a control gate formed over the top oxide layer; and a plurality of source/drain regions formed in the semiconductor substrate, wherein the etching barrier layer is not formed on the source/drain region.

2. The structure of claim 1, wherein the dielectric layer further includes:

a bottom oxide layer formed over the floating gate;

a silicon nitride layer formed over the bottom oxide layer; and a top oxide layer formed over the silicon nitride layer and on the sidewalls of the floating gate.

3. The structure of claim 1, wherein the spacers are formed from silicon nitride material.

4. A read-only memory structure formed above a semiconductor substrate having field oxide layer formed thereon, comprising:

a tunneling oxide layer formed over the semiconductor substrate;

a floating gate formed over the tunneling oxide layer;

a bottom oxide layer formed over the floating gate;

a silicon nitride layer formed over the bottom oxide layer, wherein the floating gate, the bottom oxide layer, and the silicon nitride layer together form a stacked structure;

a top oxide layer formed over the semiconductor substrate to cover the stacked structure, wherein the bottom oxide layer, the silicon nitride layer, and the top oxide layer together form a dielectric layer;

spacers formed on the sidewalls of the stacked structure but separated therefrom by the top oxide layer;

an etching barrier layer on the semiconductor substrate formed by implanting ions into the substrate followed by oxidation;

a control gate formed over the dielectric layer; and a plurality of structure/drain regions formed in the semiconductor substrate.

5. The read-only memory structure of claim 4, wherein the etching barrier layer is an ion-doped oxide region.

6. The read-only memory structure of claim 4, wherein the spacers comprise silicon nitride spacers.

7. The read-only memory structure of claim 6, wherein the spacers comprise silicon oxy-nitride layers formed on the silicon nitride spacers.

\* \* \* \* \*